United States Patent [19]

Lisner et al.

[11] Patent Number: 4,502,005
[45] Date of Patent: Feb. 26, 1985

[54] METHOD AND APPARATUS FOR DETERMINING THE ANGLE BETWEEN THE AIR-GAP FLUX VECTOR AND THE STATOR CURRENT VECTOR OF AN ASYNCHRONOUS MACHINE FED FROM AN INTERMEDIATE CURRENT-LINK FREQUENCY CONVERTER

[75] Inventors: Herbert Lisner, Ludwigshafen; Peter Michalak, Weinheim, both of Fed. Rep. of Germany

[73] Assignee: Brown, Boveri & Cie AG, Mannheim-Kafertal, Fed. Rep. of Germany

[21] Appl. No.: 363,128

[22] Filed: Mar. 29, 1982

[30] Foreign Application Priority Data

Mar. 28, 1981 [DE] Fed. Rep. of Germany ....... 3112326

[51] Int. Cl.³ .............................................. G01R 31/02
[52] U.S. Cl. ............................... 324/158 MG; 322/99
[58] Field of Search ................ 324/158 MG; 322/99; 318/490; 361/20, 23, 24; 340/648

[56] References Cited

U.S. PATENT DOCUMENTS 4,345,198 8/1982 Wolfinger .................. 324/158 MG

FOREIGN PATENT DOCUMENTS 2919852 12/1980 Fed. Rep. of Germany .
553949 4/1977 U.S.S.R. ..................... 324/158 MG

OTHER PUBLICATIONS

Blaschke, V. F.; "Das Prinzip . . . "; Siemens–Zeitschrift; 45 (1971); No. 10; pp. 757-760.
Bodefeld et al.; Elektrische Maschinen; pub. by Springer-Verlag; 1949.
Weninger, R.; "Verfahren zur . . . "; etz Archiv; (1979); No. 12; pp. 341-345.

Primary Examiner—Ernest F. Karlsen
Attorney, Agent, or Firm—Herbert L. Lerner; Laurence A. Greenberg

[57] ABSTRACT

According to the method, current blocks of the stator currents are transformed into square waves of constant amplitude and the current blocks of the stator currents are extended to 180° el. Fundamental components are filtered out from the stator voltages and the phase of the fundamental components are shifted lagging 90° el. The phase-shifted fundamental components are connected into square waves of constant amplitude, at least one square wave of the currents is multiplied by the square wave of the voltage phase following the current phase, and the mean value thereof is formed. There is also an apparatus for implementing the method.

17 Claims, 7 Drawing Figures

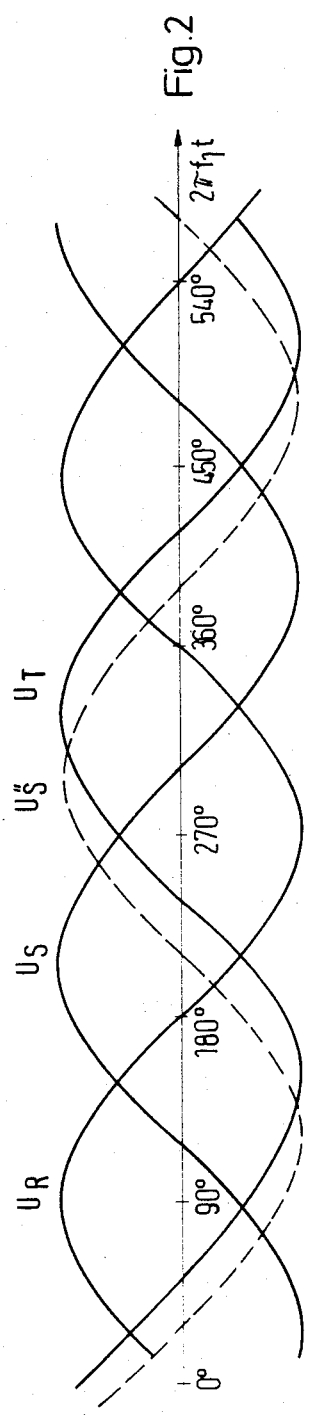
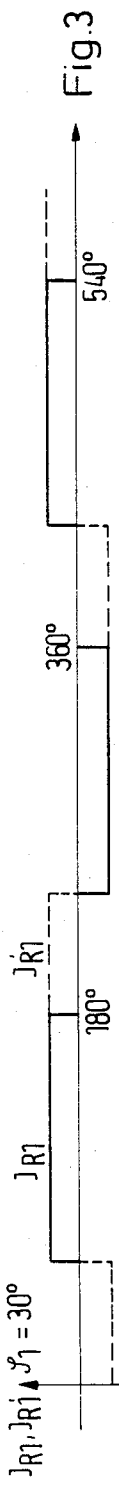
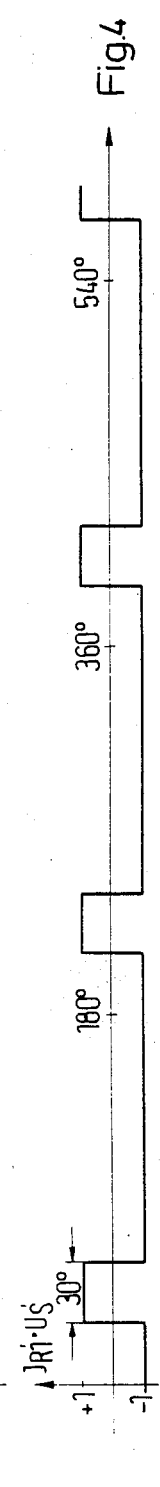
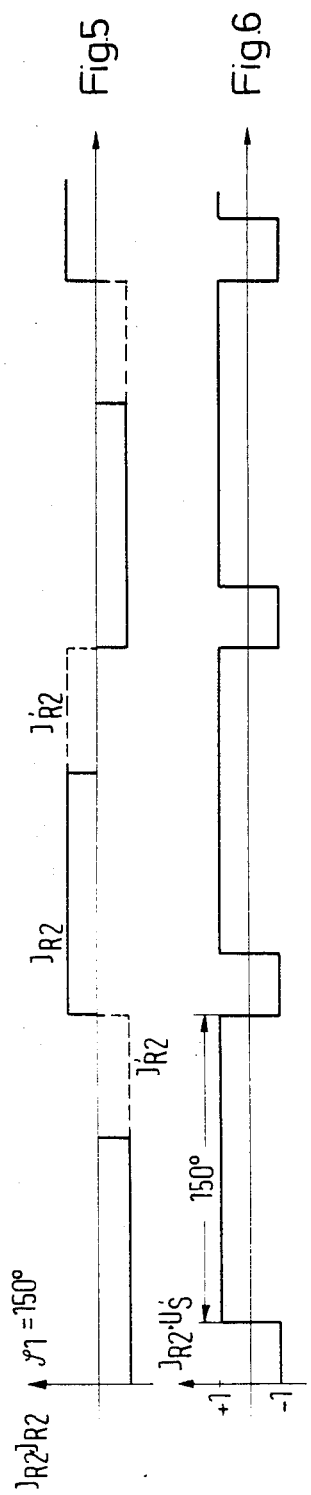

METHOD AND APPARATUS FOR DETERMINING THE ANGLE BETWEEN THE AIR-GAP FLUX VECTOR AND THE STATOR CURRENT VECTOR OF AN ASYNCHRONOUS MACHINE FED FROM AN INTERMEDIATE CURRENT-LINK FREQUENCY CONVERTER

The invention relates to a method for determining the angle between the air-gap flux vector and the stator current vector of a three-phase asynchronous machine which is fed from a frequency converter with an intermediate current link, whereby the stator voltages and the stator currents area measured. The invention further relates to an apparatus for carrying out the method.

Apparatus for measuring the air-gap flux vector is known from the publication Siemens-Zeitschrift 45 (1971), No. 10, Pages 757 to 760. This apparatus includes two Hall probes shifted 90° relative to each other in the air gap and a vector analyzer which calculates the angle which the flux vector forms with a reference line fixed to the stator, from the measurement data of the probes.

If it is desired to avoid the installation of probes in the air gap, but it is desired to nevertheless determine the angle between the flux vector and the stator current vector, the problem must be ap-proached by measurement of the stator current and the stator voltage which can be measured, of course, without intervention into the machine.

A number of methods and apparatus for determining the mutual phase shift of two periodic quantities, voltages and/or currents, are known. In the present case, however, it is an additional aggravating fact that the voltages and currents in the leads of the asynchronous machine are heavily distorted as compared to the sinusoidal form. Superimposed on the voltages are disturbances due to commutation processes in the inverter feeding the machine. The current is formed of rectangular blocks with a length of 120° el. In particular, this latter property makes a determination of the phase angle by simple comparison of the zero crossings of the current and voltage curves impossible.

A load status control for an asynchronous machine fed from a frequency converter is known from German Published Non-Prosecuted Application DE-OS No. 29 19 852. In that device, the voltages and currents in the leads to the asynchronous machine are measured and the phase shift between current and voltage or the sine or cosine thereof is calculated from these measured values. This involves a complicated circuit with function generators, dividers, multipliers, as well as summers.

It is accordingly an object of the invention to provide a method and apparatus for determining the angle between the air-gap flux vector and the stator current vector of an asynchronous machine fed from an intermediate current-link frequency converter, which overcomes the hereinafore-mentioned disadvantages of the heretofore-known methods and devices of this general type, and with which the angle between the flux vector and the stator current vector of an asynchronous machine fed from a frequency converter can be determined over a wide frequency range without the need of additions to or modifications of the machine.

With the foregoing and other objects in view there is provided, in accordance with the invention, a method for determining the angle between the air-gap flux vector and the stator current vector of a three-phase asynchronous machine being fed from a frequency converter with an intermediate current-link, at which stator voltages and stator currents are measured, which comprises transforming current blocks of the stator currents into square waves of constant amplitude and extending the current blocks of the stator currents to 180° el., filter ring out fundamental components from the stator voltages, shifting the phase of the fundamental components lagging 90° el., converting the phase-shifted fundamental components into square waves of constant amplitude, multiplying at least one square wave of the currents by the square wave of the voltage phase following the current phase, and forming the mean value thereof.

In accordance with another mode of the invention, there is provided a method which comprises evaluating phase voltages measured to a neutral point of a network feeding the asynchronous machine, as stator voltages. This embodiment has the advantage that only a minimum amount of components is necessary for the practical realization.

In accordance with a further mode of the invention, there is provided a method which comprises evaluating interlinked voltages of a network feeding the asynchronous machine as stator voltages, subtracting phase-shifted fundamental components of the voltages interlinked with the same designation with the respective current phase from each other, and transforming the voltage difference into a square wave. This variant has the advantage of making a neutral point unnecessary and of raising the voltage values by a factor of $\frac{1}{2}\cdot\sqrt{3}$.

In the method according to the invention, the amplitude information is thus first eliminated from the measured values of current and voltage and the amplitudes are normalized to a fixed value. By extending the 120° el. long current blocks to 180° el., the fundamental and their zero crossings are restored in a simple manner. The phase shift of the fundamental of the current blocks of 30° el., generated thereby, is compensated by the provision that instead of the voltage phase belonging to the respective current phase, i.e. the voltage phase of the same designation, the voltage phase following the current phase, which is furthermore shifted 90° el. lagging, is rather utilized to determine the phase shift. The square waves formed by a phase current and a phase voltage are multiplied by each other. The output signal of the multiplier contains the information regarding the phase shift between current and voltage in the lead of the asynchronous machine and the information regarding the angle between the flux vector and the stator current vector. However, the output signal of the multiplier also still contains a square wave signal with the supply frequency in the leads of the asynchronous machine; for this reason, the arithmetic mean is formed from the output signal of the multiplier. At the output of the mean-value former, a voltage is generated which, for a phase shift of $\phi=0$ has, for instance, the value $+1$; for $\phi=90°$ the value 0; and for $\phi=180°$. The value $-1$.

Although it is completely sufficient for determining the angle to interlink only one current phase and one voltage phase, an improvement can be achieved by the provision that all three current phases and all three voltage phases are processed in parallel; that the output signals of the multipliers are added up; and that the mean value is formed only from the sum signal. Therefore, in accordance with an added mode of the invention, there is provided a method which comprises multiplying the three square waves of the stator currents by corresponding square waves of the stator voltage, adding together all multiplication results and forming the mean value from the sum. This achieves the formation of the square wave component at the output of the summing amplifier which has a frequency that corresponds to 6-times the frequency in the leads of the asynchronous machine. Such higher-frequency components, however, can be filtered out by circuitwise simpler means.

In accordance with an additional mode of the invention, there is provided a method which comprises filtering out the fundamental components from the stator voltages and shifting the phase lagging 90° el. in an RC-stage. Such an RC-stage, however, not only acts as a lowpass filter and a phase shifter but also as an amplitude correction filter. As is well known, the output voltage of the frequency converters is controlled in such a way that the amplitude increases with increasing frequency as well. With increasing frequency, however, the impedance of the capacitor in the RC-stage drops so that, as seen overall, constant voltage conditions are obtained at all frequencies at the input of the circuit part which converts the fundamental of the phase voltage into a corresponding square wave.

As mentioned above, the output signals of the multipliers contain an a-c voltage component which is proportional to the frequency of the voltages and currents in the leads of the asynchronous machine. Since frequencies of voltage and current in the leads of the asynchronous machine may be between about 3 and about 150 Hz, the integration constant of the mean-value former would have to be chosen very large at the lower frequency limit in order to obtain sufficient smoothing of the average-value signal. This large integration constant, however, would lead at the upper frequency limit to an undesirable delay of the mean-value signal for fast changes of the phase shift. For this reason, in accordance with again another mode of the invention, there is provided a method which comprises forming the mean value in an integrator having an integration constant varying in proportion to the frequency of the stator voltages or stator currents.

It is a further object of the present invention to describe a circuit arrangement with which the method according to the invention can be implemented.

Therefore, in accordance with the apparatus of the invention there is provided a circuit for determining the angle between the air-gap flux vector and the stator current vector of a three-phase asynchronous machine having a supply system with terminals, which is fed from a frequency converter with an intermediate current-link, in which the stator voltages and the stator currents are measured, comprising a current transformer having an output, a zero-voltage comparator with hysteresis having an output and having an input circuit connected to the output of the current transformer, an amplitude limiter connected in the input circuit of the zero-voltage comparator with hysteresis, at least one voltage transformer having an output, a neutral point of the circuit, a differential aplifier having an output and being connected between the neutral point and the terminals of the supply system of the three-phase asynchronous machine, an RC-stage having a large time constant being connected to the output of the differential amplifier, a zero-voltage comparator without hysteresis having an input connected to the RC-stage and having an output, a multiplier having inputs connected to the outputs of the comparators and having an output, and a mean-value former connected to the output of the multiplier.

The amplitude limiter in the input circuit of the zero-voltage comparator with hysteresis assures that independently of the instantaneously flowing current, the comparator always receives an approximately constant input voltage as the switching voltage. The coparator therefore has practically the same switching behavior for all current values. This is important since the main task of the zero-voltage comparator with hysteresis is to transform the 120° el. long current blocks into 180° el. long square waves. The phase voltage and the output of the conventional voltage transformer is determined between the phase conductor and the neutral point of the supply system of the asynchronous machine. If no neutral conductor is provided, as is normally the case, the neutral can be generated artificially by means of a resistance network. The use of a differential amplifier which is preferably constructed for optimum suppression of the common mode in the input stage, allows the suppression of the common mode interference signals which are usually superimposed on the phase voltages. The operation and advantages of the integrating RC-stage with a large time constant have already been described above.

In accordance with again a further feature of the invention, there is provided a number of circuits processing the currents and a number of circuits processing the voltages each corresponding to the number of phases of the asynchronous machine, and the mean-value former includes a summer connected to the outputs of the multipliers for each phase. As already explained above, the outputs of the multipliers are then connected to a summer, from the output signal of which the mean value is then formed. Therefore, in accordance with again an added feature of the invention, there are provided two other current transformers, two other zero-voltage comparators with hysteresis each having an output and having an input circuit connected to one of the other current transformers, two other amplitude limiters each being connected in the input circuit of one of the other zero-voltage comparators with hysteresis, two other voltage transformers, two other differential amplifiers each having an output and each being connected to one of the other voltage transformers and between two terminals of the supply system of the three-phase asynchronous machine, two other RC-stages with large time constants each being connected to the output of one of the other defferential amplifiers, two other comparators without hysteresis each having first (positive) and second (negative) inputs and an output, each of the RC-stages being connected to the first input and being connected cyclically interchanged to the second input of one of the two other comparators without hysteresis, two other multipliers each being connected to the output of one of the comparators with hysteresis and one of the comparators without hysteresis, a summer having an output, the multipliers each having an output connected to the summer and the output of the summer being connected to the mean-value former.

In accordance with again an added feature of the invention, the comparator with hysteresis is a switched operational amplifier with externally connected components.

In accordance with again an additional feature of the invention, the amplitude limiter in the input circuit of the comparator with hysteresis is in the form of two antiparallel diodes. Such a circuit is very simple and inexpensive and fulfills its task excellently.

In accordance with yet another feature of the invention, the differential amplifier is an operational amplifier connected for optimum common-mode rejection. Since the sequence of the current and voltage phases changes if the direction of rotation of the asynchronous machine is changed, a switching arrangement must also be provided in the circuit arrangement according to the invention which in this case provides for the correct correlation of the currents to the voltage following the respective current phase. This switch is preferably inserted ahead of the integration and phase-shifting RC-stage. Therefore, in accordance with again an additional feature of the invention, there is provided a double-throw switch preceding the RC-stage for correctly correlating the voltage and current phases if the asynchronous machine runs clockwise or counterclockwise.

In accordance with yet another feature of the invention, the comparator without hysteresis is an operational amplifier with external components.

In accordance with yet a further feature of the invention, the summer at the multiplier output and the mean-value former are combined into a switched operational amplifier with external components; the signals are summed at the input and the mean-value formation is achieved by a capacitor fed back from the output to the input.

As described above, it is desirable to have a large integration constant at the lower frequency limit and a small integration constant at the upper frequency limit for forming the average value.

In accordance with yet an added feature of the invention, there is provided a further multiplier having a first input connected to the summer and mean-value former, a second input and an output, means connected to the second input of the further multiplier for providing a signal proportional to the frequency of the network supplying the asynchronous machine, and a resistor through which the output of the further multiplier is fed back to the input of the summer and mean-value former, a signal corresponding to the angle to be determined being taken off at the output of the further multiplier. The signal at the second input of the multiplier is a d-c voltage signal, the magnitude of which is directly proportional to the supply frequency of the asynchronous machine. By means of this circuit it is possible to generate a large integration constant for low frequencies and a small integration constant for high frequencies. It is the value corresponding to the phase shift between current and voltage in the leads of the asynchronous machine that can be taken off at the output of the multiplier.

For adaptation to the level, the output of the multiplier can be followed by an additional operational amplifier which is connected as a range adaptation stage. Therefore, in accordance with a concomitant feature of the invention, there is provided an operational amplifier being connected as a level-adaptation stage directly to the output of the further multiplier and having an output at which the signal corresponding to the angle to be determined can be taken off.

Other features which are considered as characteristic for the invention are set forth in the appended claims.

Although the invention is illustrated and described herein as embodied in a method and apparatus for determining the angle between the air-gap flux vector and the stator current vector of an asynchronous machine fed from an intermediate current-link frequency converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a diagram showing the waveform of the phase voltage in the three-phase leads of an asynchronous machine as well as a phase voltage shifted 90° el. lagging;

FIG. 3 is a diagram showing the position of a phase current for a phase shift of 30° between voltages and currents;

FIG. 4 is a view similar to FIG. 3 of the voltage waveform and the output of the multiplier for a phase shift of 30°;

FIG. 5 is another view similar to FIG. 3 of the position of a phase current for a phase shift of 150° between voltages and currents;

FIG. 6 is a further view similar to FIG. 3 of the voltage waveform at the output of the multiplier for a phase shift of 150°.

Figure 1:
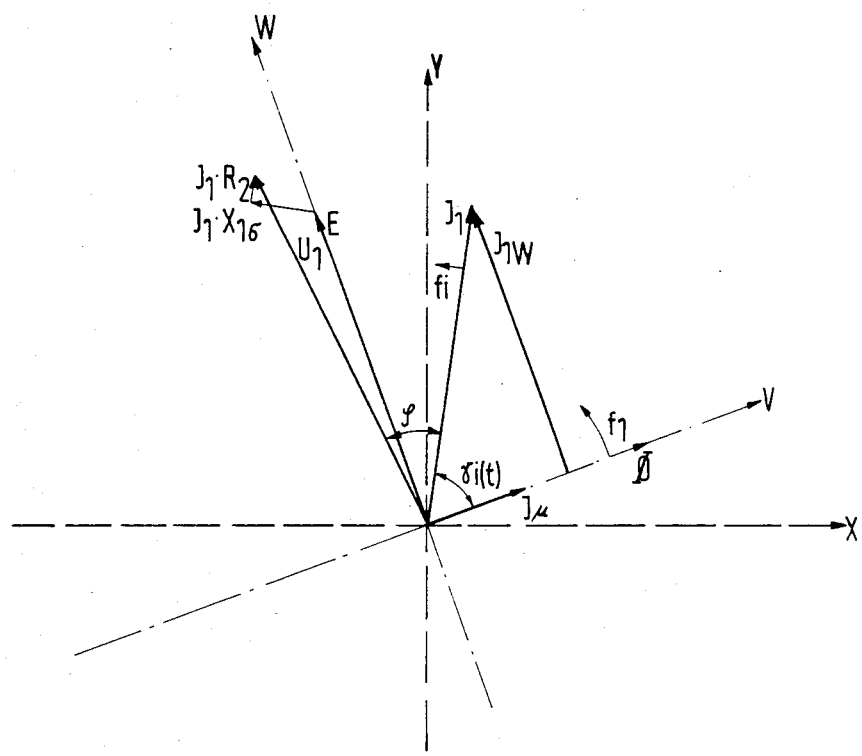
FIG. 1 is a vector diagram of the voltages and currents of an asynchronous machine in undersynchronous operation.

Referring now to the figures of the drawing and first particularly to FIG. 1 thereof, there is seen a vector diagram which is a combination of the publications Boedefeld/Sequenz "Elektrische Maschinen", 4. edition, 1949, FIG. 235 and ETZ-Archiv (1939) No. 12, Page 342, FIG. 1. In the figure there is seen a first orthogonal coordinate system with the coordinate axes X, Y which is assumed to be anchored in fixed relationship in the stator of the machine. There is further seen an orthogonal coordinate system with the coordinate axes V, W, the abscissa V of which coincides with the flux vector and rotates with the rotating flux frequency $f_1$. In the rotating coordinator system V, W, the current and voltage vectors of the asynchronous machine are shown. There will be seen the magnetizing current $I\mu$, the stator current $I_1$ and the active component of the stator current $I_{1w}$. The vector of the magnetizing current $I\mu$ or the vector $\Phi$ of the air-gap flux, respectively, and the vector $I_1$ of the stator current enclose a current angle $\gamma$. The stator current vector $I_1$ rotates with a stator current rotary frequency $f_1$.

The vector of the electromotive force E is perpendicular to the vector of the magnetizing current $I\mu$ or the air-gap flux $\Phi$, respectively. The voltage drops in the stator circuit are vectorially added to the electromotive force E. The sum corresponds exactly to the instantaneous stator voltage $U_1$. The phase shift $\phi$ exists between the stator voltage $U_1$ and the stator current $I_1$.

As mentioned above, the flux vector $\Phi$ rotates relative to the stator winding with the rotary frequency $f_1$ and the stator current vector $I_1$ rotates with the rotary frequency $f_j$. Between the flux vector $\Phi$ and the stator current vector $I_1$ there is disposed the current angle $\gamma$ which changes with the slip frequency. In the steadystate operating condition, the two frequencies $f_1$ and $f_i$ are equal. In the event of dynamic processes, the length of the stator current vector $I_1$ remains constant since the current amplitude is impressed by the frequency converter. The current amplitude only changes after the delay time which is imminent to the current control loop. The asynchronous machine can therefore only react to a change of the current angle $\gamma$.

Since the current angle $\gamma$ cannot be measured directly at the terminals of the asynchronous machine and, as presumed, sensors for the flux vector $\Phi$ are not to be used, the current angle must be measured by a detour through the phase shift between the stator current $I_1$ and the stator voltage $U_1$. It is necessary in this case, however, that the angle deviation between the vector of the electromotive force E and the vector of the stator voltage $U_1$ be neglected.

It can be shown that in spite of this neglect, the control behavior of a current angle control according to the invention is better than that of a conventional control, in which the changes of the current angle $\gamma$ are ignored or calculated by a detour through the magnitude of the intermediate-link voltage or the magnitude of the rotor speed.

FIG. 2 shows the waveform of the stator voltages $U_R$, $U_S$, $U_T$ of a three-phase supply network, only the fundamental components being shown. The three voltages are each phase-shifted 120° el. relative to each other. Further shown is the waveshape of the lagging 90° el. phase-shifted voltage $U_S''$.

FIG. 3 shows the 120° el. long current blocks of a stator current $I_{R1}$ as well as the corresponding square wave $I_{R1}'$, extended 180° el. for a phase shift of $\phi_1 = 30°$.

FIG. 4 shows the waveform of the voltage at the output of a multiplier in which the square waves according to the voltages $U_S'$ and the current $I_{R1}'$ are multiplied by each other. It is seen that the positive voltage components are exactly 30° el. long and the negative voltage components are 150° el. long. The arithmetic mean value of this sequence of rectangles has a magnitude of $-0.67$.

FIG. 5 shows the phase current $I_{R2}$ and the square wave $I_{R2}'$ which is formed therefrom and extended to 180° el. for a phase shift of $\phi_2 = 150°$.

FIG. 6 shows the result at the output of the multiplier. It is seen that the positive voltage components are 150° el. long, and the negative voltage components are 30° el. long, and that the arithmetic mean of this voltage wave has a magnitude of $+0.67$.

Figure 7:
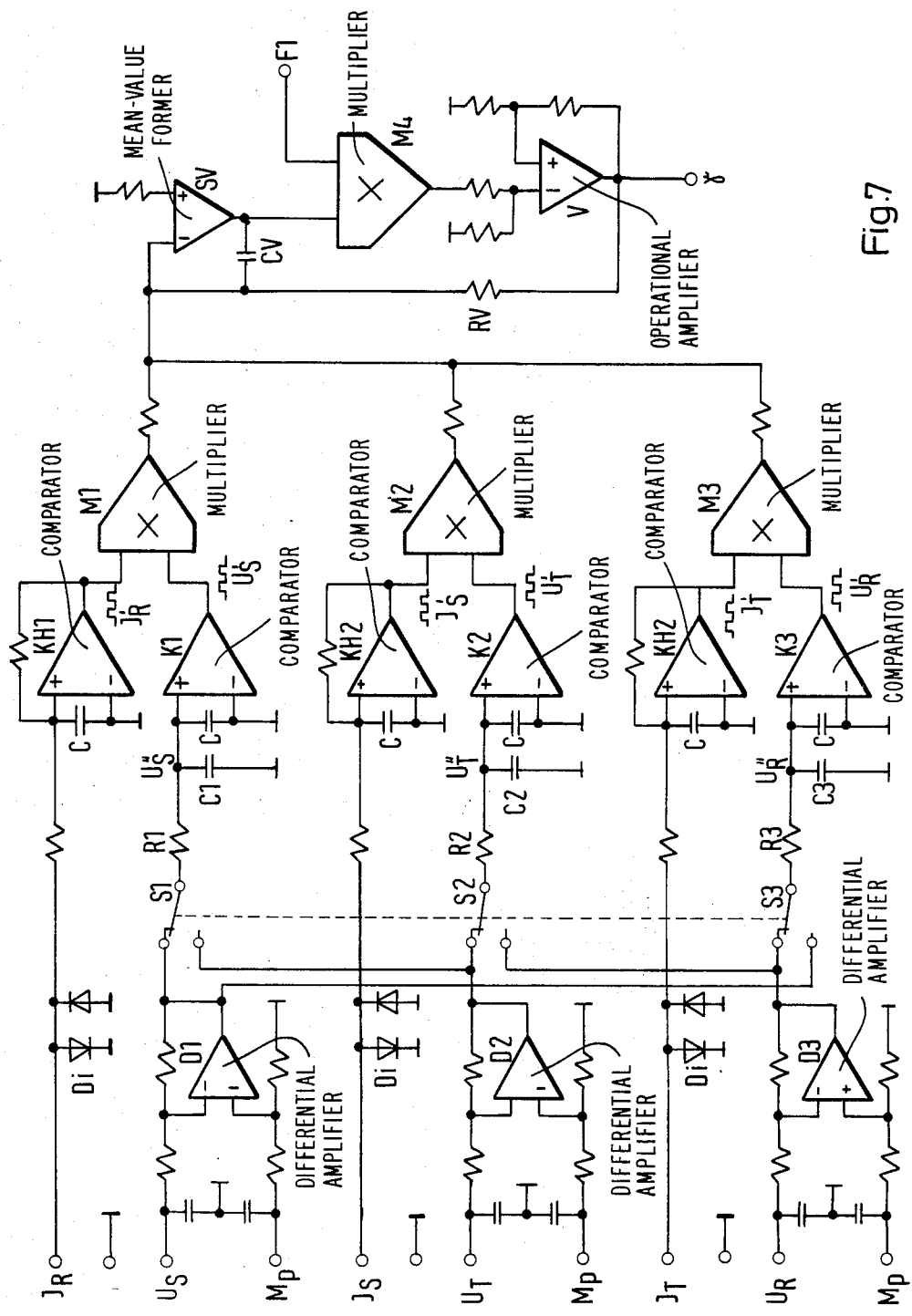
FIG. 7 is a schematic circuit arrangement of a device for determining an angle in a three-phase asynchronous machine with a neutral conductor.

FIG. 7 shows a circuit arrangement for a four-conductor supply network. If the signal for the stator current $I_R$ coming from a non-illustrated current transformer is initially followed, it is seen that this signal is first amplitude-limited by means of two antiparallel-connected diodes Di and is fed through a resistor to the input of an operational amplifier connected as a zero-voltage comparator KH1 with hysteresis. A capacitor C at the input of this and all other comparators serves to conduct short interference pulses which were able to pass the amplitude-limiting diodes Di, to ground. As soon as a positive signal voltage is present at the input of the comparator KH1, the output is likewise switched to a positive signal. Because of the hysteresis, this positive output signal is preserved even if the input signal in the current pauses of the current $I_R$ becomes zero. Only when the input signal becomes negative, is the comparator KH1 also switched to a negative signal at the output. In this manner, the extension of the 120° el. long input signal blocks to 180° el. long output signal blocks is realized.

The voltage signal $U_S$ between the phase conductor and the neutral conductor Mp coming from a non-illustrated voltage transformer travels to a differential amplifier D1 which is connected for optimum common-mode suppression. The signal is fed from the output of the differential amplifier D1 through a double-throw switch S1 to an integrating RC-stage R1, C1 with a large time constant. The fundamental $U_S''$ which is present at the output of this RC-stage has been largely freed of harmonics and interference and has been shifted lagging by 90° el. A comparator K1 without hysteresis forms a square wave $U_S'$ from this voltage signal $U_S''$.

The outputs of the two comparators KH1 and K1 are fed to the two inputs of a multiplier M1, which multiplies the two square waves and delivers a signal at the output which contains, besides the a-c component with the frequency of the current $I_R$ and the voltage $U_S$, amplitude information which corresponds to the phase shift $\phi$ between the phase voltage $U_S$ and the phase current $I_R$ and is at the same time a measure for the angle between the flux vector and stator current vector.

Through two further channels of identical construction, the currents $I_S$ and $I_T$ as well as the voltage $U_T$ are also interlinked. By means of the coupled double-throw switches S1, S2, S3 it is possible to interlink the respective voltage phase following each current phase, multiplicatively with the current phase, depending on the direction of rotation of the asynchronous machine.

The outputs of the three multipliers M1, M2, M3 are summed at the input of an operational amplifier SV which is connected as a summing stage and mean-value former. By means of the capacitor CV, the operational amplifier SV simultaneously acts as an integrator, so that the mean-value of the input voltage is present at its output.

In order to allow the integration constant of the mean-value former SV, CV to be controlled in dependence on the frequency, the output of the mean-value former SV is connected to a multiplier M4, the second input of which has a d-c voltage F1 being fed thereto which is directly proportional to the frequency of the phase voltages and phase currents. The operational amplifier V following the multiplier M4 serves as a level adaptation amplifier. From its output, a resistor RV is connected to the input of the summing stage and mean-value former SV. Depending on the voltage F1, enough feedback signal is coupled through this resistor RV to the input of the mean-value former SV, that a large time constant is set at low frequencies and a small voltage F1, and a small time constant is set for high supply frequencies and a large voltage F1.

The circuit arrangement for a second variant, in which the linked voltages of the supply network are evaluated, differs from that shown in FIG. 7 only by the feature that the lower inputs of the differential amplifiers D1, D2, D3 are connected to a phase conductor instead of to a neutral conductor Mp. The combination of the voltages and currents must be chosen in such a way that the stator current $I_R$ is interlinked with the voltages $U_S$ and $U_R$; the current $I_S$ is interlinked with the voltages $U_T$ and $U_S$; and the current $I_T$ is interlinked with the voltages $U_R$ and $U_T$. In addition, the lower (minus or inverting) inputs of the comparators K1, K2, K3 without hysteresis must be connected to the upper (plus or non-inverting) inputs of the respective, cyclically preceding comparator instead of to ground, so that the correct phase angle is obtained by forming the difference between the interlinked voltages.

We claim:

1. Method for determining the angle between the air-gap flux vector and the stator current vector of a three-phase asynchronous machine being fed from a frequency converter with an intermediate current-link, at which stator voltages and stator currents are measured, which comprises transforming current blocks of the stator currents into square waves of constant amplitude and extending the current blocks of the stator currents to 180° el., filtering out fundamental components from the stator voltages, shifting the phase of the fundamental components lagging 90° el., converting the phase-shifted fundamental components into square waves of constant amplitude, multiplying at least one square wave of the currents by the square wave of the voltage phase following the current phase, and forming the mean value thereof.

2. Method according to claim 1, which comprises evaluating phase voltages measured to a neutral point of a network feeding the asynchronous machine, as stator voltages.

3. Method according to claim 1, which comprises evaluating interlinked voltages of a network feeding the asynchronous machine as stator voltages, subtracting phase-shifted fundamental components of the voltages interlinked with the same designation with the respective current phase from each other, and transforming the voltage difference into a square wave.

4. Method according to claim 1, 2 or 3, which comprises multiplying the three square waves of the stator currents by corresponding square waves of the stator voltage, adding together all multiplication results and forming the mean value from the sum.

5. Method according to claim 1, which comprises filtering out the fundamental components from the stator voltages and shifting the phase lagging 90° el. in an RC-stage.

6. Method according to claim 1, which comprises forming the mean value in an integrator having an integration constant varying in proportion to the frequency of the stator voltages or stator currents.

7. Circuit for determining the angle between the air-gap flux vector and the stator current vector of a three-phase asynchronous machine having a supply system with terminals, comprising a current transformer having an output, a zero-voltage comparator with hysteresis having an output and having an input circuit connected to the output of said current transformer, an amplitude limiter connected in said input circuit of said zero-voltage comparator with hysteresis, at least one voltage transformer having an output, a neutral point of the circuit, a differential amplifier having an output and being connected between said neutral point and the terminals of the supply system of the three-phase asynchronous machine, an RC-stage having a large time constant being connected to the output of said differential amplifier, a zero-voltage comparator without hysteresis having an input connected to said RC-stage and having an output, a multiplier having inputs connected to the outputs of said comparators and having an output, and a mean-value former connected to the output of said multiplier.

8. Circuit according to claim 7, including a number of circuits processing the currents and a number of circuits processing the voltages each corresponding to the number of phases of the asynchronous machine, and said mean-value former includes a summer connected to the outputs of the multipliers of each phase.

9. Circuit according to claim 7, including two other current transformers, two other zero-voltage comparators with hysteresis each having an output and having an input circuit connected to one of said other current transformers, two other amplitude limiters each being connected in the input circuit of one of said other zero-voltage comparators with hysteresis, two other voltage transformers, two other differential amplifiers each having an output and each being connected to one of said other voltage transformers and between two terminals of the supply system of the three-phase asynchronous machine, two other RC-stages with large time constants each being connected to the output of one of said other differential amplifiers, two other comparators without hysteresis each having first and second inputs and an output, each of said RC-stages being connected to the first input and being connected cyclically interchanged to the second input of one of said two other comparators without hesteresis, two other multipliers each being connected to the output of one of said comparators with hysteresis and one of said comparators without hysteresis, a summer having an output, said multipliers each having an output connected to said summer and the output of the summer being connected to said mean-value former.

10. Circuit according to claim 7, 8 or 9, wherein said comparator with hysteresis is an operational amplifier with externally connected components.

11. Circuit according to claim 7, 8 or 9, wherein said amplitude limiter in the input circuit of said comparator with hysteresis is in the form of two antiparallel diodes.

12. Circuit according to claim 7, 8 or 9, wherein said differential amplifier is an operational amplifier connected for optimum common-mode rejection.

13. Circuit according to claim 7, 8 or 9, including a double-throw switch preceding said RC-stage for correctly correlating the voltage and current phases if the asynchronous machine runs clockwise or counterclockwise.

14. Circuit according to claim 7, 8 or 9, wherein said comparator without hysteresis is an operational amplifier with external components.

15. Circuit according to claim 8 or 9, wherein said summer at the multiplier output and said mean-value former are combined into an operational amplifier with external components.

16. Circuit according to claim 15, including a further multiplier having a first input connected to said summer and mean-value former, a second input and an output, means connected to said second input of said further multiplier for providing a signal proportional to the frequency of the network supplying the asynchronous machine, and a resistor through which said output of said further multiplier is fed back to the input of said summer and mean-value former, a signal corresponding to the angle to be determined being taken off at said output of said further multiplier.

17. Circuit according to claim 16, including an operational amplifier being connected as a level-adaptation stage directly to said output of said further multiplier and having an output at which the signal corresponding to the angle to be determined can be taken off.

* * * * *

UNITED STATES PATENT AND TRADEMARK OFFICE
CERTIFICATE OF CORRECTION

PATENT NO. : 4,502,005
DATED : February 26, 1985
INVENTOR(S) : HERBERT LISNER and PETER MICHALAK It is certified that error appears in the above-identified patent and that said Letters Patent are hereby corrected as shown below:

In the heading, item (21), line 16,

"(21) Appl. No.: 363,128"

should read

--(21) Appl. No.: 363,129--.

Signed and Sealed this

Twenty-fourth Day of February, 1987

Attest:

DONALD J. QUIGG

Attesting Officer

Commissioner of Patents and Trademarks